(12) United States Patent
Amoah et al.

(10) Patent No.: US 8,890,557 B2
(45) Date of Patent: Nov. 18, 2014

(54) BUILT-IN SELF-TEST METHOD AND STRUCTURE

(75) Inventors: Yoba Amoah, Fairfax, VT (US); John J. Ellis-Monaghan, Grand Isle, VT (US); Roger C. Kuo, South Burlington, VT (US); Molly J. Leitch, Nashville, TN (US); Zhihong Zhang, Chandler, AZ (US)

(73) Assignee: International Business Machines Corporation, Armonk, NY (US)

( * ) Notice: Subject to any disclaimer, the term of this patent is extended or adjusted under 35 U.S.C. 154(b) by 256 days.

(21) Appl. No.: 13/443,450

(22) Filed: Apr. 10, 2012

(65) Prior Publication Data

US 2013/0265068 A1    Oct. 10, 2013

(51) Int. Cl.
*G01R 31/3187* (2006.01)

(52) U.S. Cl.
USPC ........................................... 324/750.3

(58) Field of Classification Search
USPC ............... 324/750.3, 754.07, 754.03, 755.01, 324/757.02–757.05, 762.02, 762.03, 500; 702/19, 22; 714/718, 721, 724–742; 365/176, 180, 208
See application file for complete search history.

(56) References Cited

U.S. PATENT DOCUMENTS

| | | | |
|---|---|---|---|
| 4,585,931 A | 4/1986 | Duncan et al. | |
| 5,285,082 A | 2/1994 | Axer | |
| 5,389,556 A | 2/1995 | Rostoker et al. | |
| 5,811,983 A | 9/1998 | Lundberg | |
| 5,881,067 A | 3/1999 | Narayanan et al. | |
| 6,399,400 B1 | 6/2002 | Osann, Jr. et al. | |
| 6,570,808 B2 | 5/2003 | Lee | |
| 6,670,800 B2 | 12/2003 | Beach et al. | |
| 6,680,484 B1 | 1/2004 | Young | |
| 6,710,616 B1 | 3/2004 | D'Souza | |
| 6,784,685 B2 | 8/2004 | Chao et al. | |
| 6,871,307 B2 | 3/2005 | Nachumovsky | |
| 7,245,134 B2 * | 7/2007 | Granicher et al. | ....... 324/754.07 |

(Continued)

FOREIGN PATENT DOCUMENTS

| | | |
|---|---|---|
| JP | 62054932 | 10/1987 |
| JP | 2005057145 A | 3/2005 |

OTHER PUBLICATIONS

Tanoi et al., "On-Wafer BIST of a 200-Gb/s Failed-Bit Search for 1-Gb DRAM", IEEE, 1997.

(Continued)

*Primary Examiner* — Melissa Koval
*Assistant Examiner* — Trung Nguyen
(74) *Attorney, Agent, or Firm* — Michael J. LeStrange; Hoffman Warnick LLC

(57) ABSTRACT

A method of testing a semiconductor wafer and a related structure. In various embodiments, a method includes: placing a probe on a first chip on the semiconductor wafer; testing a scribe line automatic built-in self-test (ABIST) for the first chip to search for a fault; progressively testing a subsequent scribe line ABIST for a subsequent chip on the semiconductor wafer in response to determining the ABIST for the first chip does not indicate the fault; moving the probe point to the subsequent chip and retesting the subsequent scribe line ABIST in response to determining the ABIST for the subsequent chip indicates a fault; and testing a further subsequent scribe line ABIST for a further subsequent chip on the semiconductor wafer in response to determining the retesting of the subsequent scribiline ABIST does not indicate a fault in the subsequent scribe line ABIST.

18 Claims, 2 Drawing Sheets

(56) References Cited

U.S. PATENT DOCUMENTS

| | | |
|---|---|---|
| 7,382,147 B2 | 6/2008 | Cano et al. |
| 7,432,115 B2 | 10/2008 | Kinoshita |
| 7,494,829 B2 | 2/2009 | Subramaniam et al. |
| 7,567,947 B2 | 7/2009 | Balog |
| 7,644,389 B2 | 1/2010 | Hennig et al. |
| 7,781,890 B2 | 8/2010 | Pourkeramati et al. |
| 2003/0030459 A1* | 2/2003 | Sabey .......................... 324/761 |
| 2008/0116910 A1* | 5/2008 | Hung ........................... 324/754 |
| 2010/0237891 A1 | 9/2010 | Lin et al. |
| 2010/0244879 A1 | 9/2010 | Hung |
| 2011/0050273 A1 | 3/2011 | Ma |

OTHER PUBLICATIONS

Lin et al, "Sigma-Delta Modulation Based Wafer-Level Testing for TFT-LCD Source Driver ICs", IEEE, 2011.

* cited by examiner

BUILT-IN SELF-TEST METHOD AND STRUCTURE

FIELD OF THE INVENTION

The subject matter disclosed herein relates to built-in self-testing of semiconductor wafers. More specifically, aspects of the invention relate to methods of built-in self-testing of semiconductor wafers and structures of testing such wafers.

BACKGROUND

Testing of semiconductor wafers can be time consuming and expensive. Conventional attempts to reduce testing costs have focused on identifying bad die in a wafer and isolating those bad die from testing. However, these attempts have failed at preventing the unnecessary testing of bad die.

BRIEF SUMMARY

A method of testing a semiconductor wafer and a related structure are disclosed. In various embodiments, a method includes: placing a probe on a first chip on the semiconductor wafer; testing a scribe line automatic built-in self-test (ABIST) for the first chip to search for a fault; progressively testing a subsequent scribe line ABIST for a subsequent chip on the semiconductor wafer in response to determining the ABIST for the first chip does not indicate the fault; moving the probe point to the subsequent chip and retesting the subsequent scribe line ABIST in response to determining the ABIST for the subsequent chip indicates a fault; and testing a further subsequent scribe line ABIST for a further subsequent chip on the semiconductor wafer in response to determining the retesting of the subsequent scribiline ABIST does not indicate a fault in the subsequent scribe line ABIST.

A first embodiment of the invention includes a method of testing a semiconductor wafer, the method including: placing a probe point on a first chip on the semiconductor wafer; testing a scribe line automatic built-in self-test (ABIST) for the first chip to search for a fault; progressively testing a subsequent scribe line ABIST for a subsequent chip on the semiconductor wafer in response to determining the ABIST for the first chip does not indicate the fault; moving the probe point to the subsequent chip and retesting the subsequent scribe line ABIST in response to determining the ABIST for the subsequent chip indicates a fault; and testing a further subsequent scribe line ABIST for a further subsequent chip on the semiconductor wafer in response to determining the retesting of the subsequent scribiline ABIST does not indicate a fault in the subsequent scribe line ABIST.

A second embodiment of the invention includes a semiconductor wafer structure having: a plurality of chips; and a plurality of scribe lines, each scribe line separating two adjacent chips in the plurality of chips, wherein each scribe line includes a built-in self-test (BIST) engine configured to provide identity information about the scribe line in response to contact from a probe.

A third embodiment of the invention includes a method of testing a semiconductor wafer, the method including: placing a probe on a chip on the semiconductor wafer; testing a scribe line automatic built-in self-test (ABIST) for the chip to search for a fault; progressively testing a subsequent scribe line ABIST for each of a plurality of subsequent chips on the semiconductor wafer in response to determining the ABIST for the first chip does not indicate the fault; moving the probe point to a first subsequent chip and retesting the subsequent scribe line ABIST for the first subsequent chip in response to determining the ABIST for the first subsequent chip indicates a fault; moving the probe point to a further subsequent chip in the plurality of subsequent chips and testing a further subsequent scribe line ABIST for the further subsequent chip in response to the retesting of the subsequent scribe line ABIST indicating a fault; and testing a remainder of the plurality of subsequent chips to search for an additional fault.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
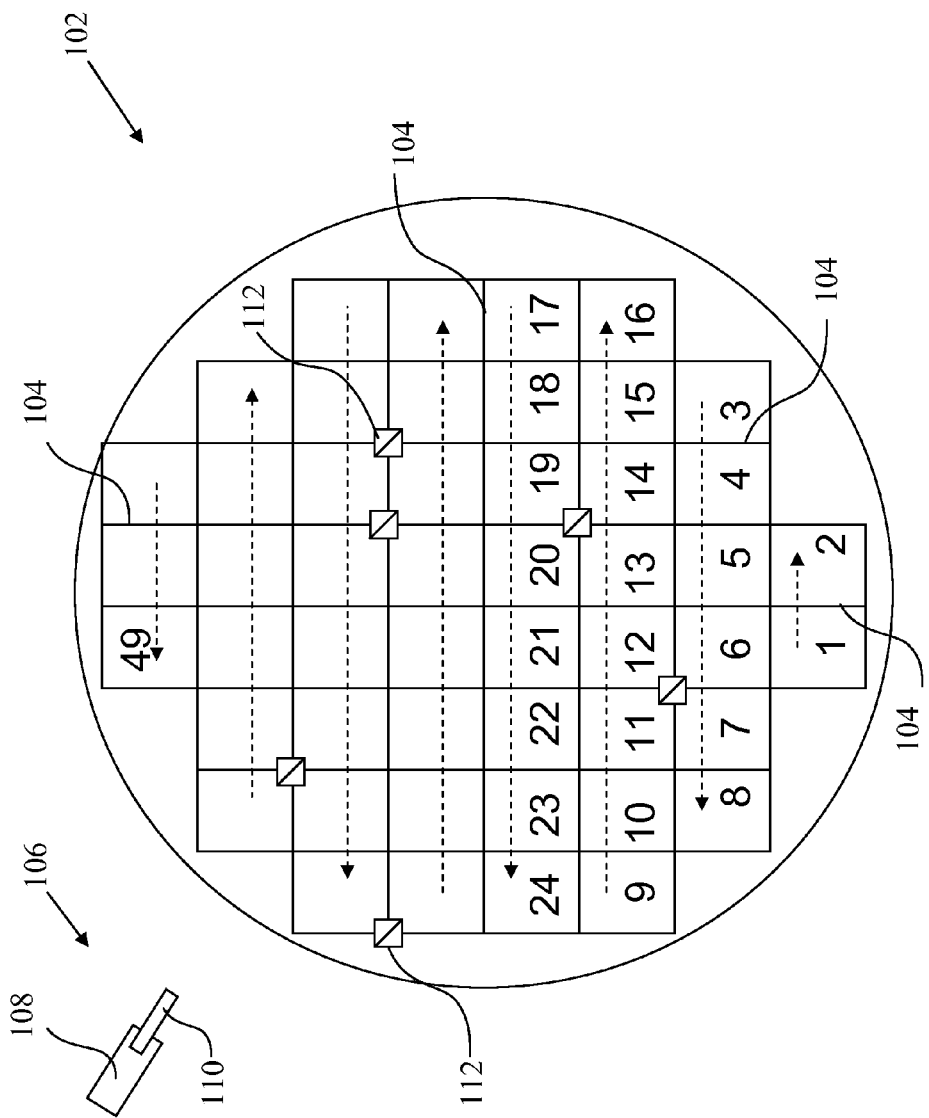
FIG. 1 shows a schematic plan view of a semiconductor wafer according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

The subject matter disclosed herein relates to built-in self-testing (BIST) of semiconductor wafers. More specifically, aspects of the invention relate to methods of built-in self-testing of semiconductor wafers and structures of testing such wafers. It is understood that the BIST processes described herein are performed prior to functional testing of a wafer structure, and are intended to allow for enhanced wafer structure testing while minimizing the number of probe passes required to perform that testing.

In various embodiments, a method of testing a semiconductor wafer is disclosed. In some cases, the method includes: placing a probe on a first chip on the semiconductor wafer; testing a scribe line automatic built-in self-test (ABIST) for the first chip to search for a fault; progressively testing a subsequent scribe line ABIST for a subsequent chip on the semiconductor wafer in response to determining the ABIST for the first chip does not indicate the fault; moving the probe point to the subsequent chip and retesting the subsequent scribe line ABIST in response to determining the ABIST for the subsequent chip indicates a fault; and testing a further subsequent scribe line ABIST for a further subsequent chip on the semiconductor wafer in response to determining the retesting of the subsequent scribe line ABIST does not indicate a fault in the subsequent scribe line ABIST.

In this case, the method can further include moving the probe point to the further subsequent chip and retesting the further subsequent scribe line ABIST in response to determining the ABIST for the further subsequent chip indicates the fault in the ABIST for the subsequent chip. In some cases, the method can further include repeating the moving of the probe point and the testing of the further subsequent scribe line ABIST for a remainder of chips on the semiconductor wafer. In these cases, the method can further include performing a functional test on the semiconductor wafer after the repeating of the moving of the probe point and the testing of the further subsequent scribe line ABIST for the remainder of the chips on the semiconductor wafer.

In various embodiments, the "subsequent chip" is adjacent to the first chip, and the "further subsequent chip" is adjacent to the subsequent chip. In various embodiments, the testing includes contacting (electrically contacting) a probe point with a testing probe. In various embodiments, the probe point remains fixed until the fault is indicated.

As described herein, it is understood that in various embodiments, the scribe line ABIST for the first chip, the subsequent chip and the further subsequent chip are electrically connected. Even further, as described herein the scribe line ABIST for these chips (first, subsequent, further subsequent, etc.) can include circuitry for providing an identify of the scribe line (or adjacent chip) when probed (electrically probed). In some cases, the scribe line ABIST for these chips is digitally testable.

In various other embodiments, a semiconductor wafer structure is disclosed. In some cases, the semiconductor wafer structure includes: a plurality of chips; and a plurality of scribe lines, each scribe line separating two adjacent chips in the plurality of chips, wherein each scribe line includes a built-in self-test (BIST) engine configured to provide identity information about the scribe line in response to contact from a probe.

In various other embodiments, a method of testing a semiconductor wafer is disclosed. The method can include the following process: placing a probe on a chip on the semiconductor wafer; testing a scribe line automatic built-in self-test (ABIST) for the chip to search for a fault; progressively testing a subsequent scribe line ABIST for each of a plurality of subsequent chips on the semiconductor wafer in response to determining the ABIST for the first chip does not indicate the fault; moving the probe point to a first subsequent chip and retesting the subsequent scribe line ABIST for the first subsequent chip in response to determining the ABIST for the first subsequent chip indicates a fault; moving the probe point to a further subsequent chip in the plurality of subsequent chips and testing a further subsequent scribe line ABIST for the further subsequent chip in response to the retesting of the subsequent scribe line ABIST indicating a fault; testing a remainder of the plurality of subsequent chips to search for an additional fault.

Turning to FIG. 1, a semiconductor wafer structure 102 is shown according to various embodiments of the invention. The semiconductor wafer structure 102 can include a plurality of chips, or die (e.g., integrated circuit chips or die), numbered 1 through 49 (some numbering omitted) in FIG. 1. Between and separating adjacent chips in the plurality of chips are scribe lines 104. As is known in the art, scribe lines 104 are an area between chips (or, die) intentionally left without circuitry. These areas are created without circuitry to allow a saw to pass along the scribe line 104 and dice the chips (or, die) apart after formation.

FIG. 1 also shows schematic process flow lines (shown as phantom dashed arrows) which illustrate a general process flow performed on the semiconductor wafer structure 102 according to various aspects of the invention described further herein. Additionally, FIG. 1 illustrates a conventional probe device 106 having a base 108 and a probe 110 for testing the scribe lines 104 of the semiconductor wafer structure 102 in accordance with various aspects of the invention.

In various aspects of the invention, each scribe line 104 includes an automatic built-in-self-test (ABIST) engine configured to provide identity information about the scribe line 104 in response to contact from the probe 110. In some embodiments, the ABIST engine can include a digitally testable probe point which can be tested by one or more probe device(s) 106. In various embodiments, adjacent scribe lines 104 are electrically connected such that current can flow through these adjacent scribe lines 104 and aid in testing of those scribe lines 104 and one or more of the plurality of chips 1, 2, 3, etc. as described according to various embodiments of the invention. In some cases, the electrical connection between scribe lines 104 allows for testing of the plurality of scribe lines 104 without moving the probe point (location of probe 110). As shown, the wafer structure 102 can further include one or more transmission gates 112 (limited labeling for clarity of illustration) enabling electrical connection/disconnection of the adjacent scribe lines 104. The transmission gates 112 can be used to isolate one or more scribe lines 104 in the wafer structure 102 to allow for testing of the chips 1, 2, 3, etc. and/or those lines 104 themselves.

As described herein, the "testing" of one or more chips 1, 2, 3, etc. and/or scribe lines 104 can be performed by at least one of: measuring open circuits and/or short circuits via a defect monitor, measuring threshold voltages and current drops via ring oscillators (e.g., with counters for total delay time), and/or measuring resistances and/or capacitances by adding those delays into ring oscillators as delay elements. It is understood that "probing" as described herein can include reading (when available) or programming chip identification information (IDs) by sending programming signals to the probed chip (via the probe device). Additionally, probing can include sending programming signals to adjacent chips (via a contacted probe point). The probing can further include reading the chip IDs of the chip being probed and adjacent chips, and in some cases, these chip IDs can be read in chip order, providing a location of each chip in a chain of adjacent chips.

Figure 2:
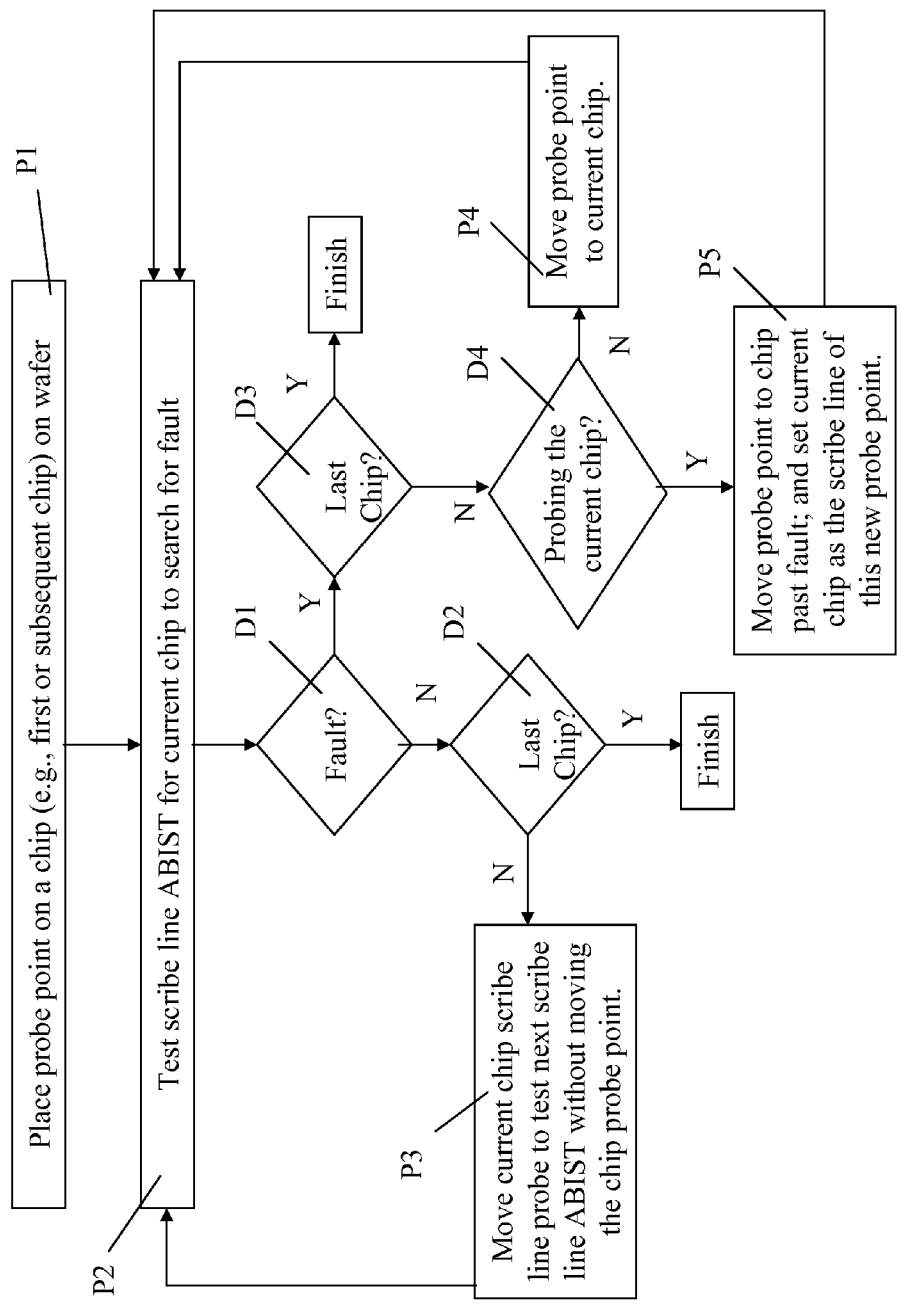
FIG. 2 shows a flow diagram illustrating a method according to various embodiments of the invention.

Turning to FIG. 2, and with continuing reference to FIG. 1, a flow diagram is shown illustrating a method according to various embodiments of the invention. In a first process P1, the method can include placing a probe (e.g., probe 110) on a chip (e.g., chip 1 or subsequent chip) on the semiconductor wafer 102. Following placement of the probe, process P2 can include testing an ABIST in a scribe line (e.g., scribe line 104) using an additional probe device 106 for the current chip (e.g., first chip 1 or subsequent chip) to search for a fault in the current chip (Fault indicated by decision D1). The scribe line (e.g., scribe line 104) tested can be the scribe line separating the current chip and an adjacent chip (e.g., chip 1 and chip 2). In the case that the current chip does not have a fault (No to decision D1), the process can progress to decision D2 to determine whether the current chip is the last chip on the wafer to be tested. In the case that the current chip is the last chip on the wafer to be tested (Yes to D2), then the process finishes. In the case that the current chip is not the last chip to be tested (No to decision D2), then process P3 includes moving (and electrically connecting) the second probe device 106 to a scribe line ABIST for the adjacent (or, next) chip, while keeping the chip probe (e.g., probe 110) in place. This process is performed with the passgate devices in the scribelines, and the associated wiring from scribeline to scribeline. The process then recycles to process P2, where the newly placed scribe line ABIST is tested for the current chip.

Returning to decision D1, in the case that testing of the scribe line ABIST for the current chip indicates a fault (Yes to Decision D1), the process can progress to decision D3 to determine whether the current chip is the last chip on the wafer to be tested. In the case that the current chip is the last chip on the wafer to be tested (Yes to D3), then the process finishes. In the case that the current chip is not the last chip to be tested (No to decision D3), the process can progress to decision D4 to determine whether the current chip is the chip being probed (e.g., the scribe line ABIST for the current chip is being probed). In the case that the current chip is not the chip being probed (N to decision D4), then process P4 includes moving the probe point (e.g., probe 110) to the current chip, and returning to process P2 to test the scribe line ABIST for the current chip. In the case that the current chip is the chip being probed (Yes to decision D4), the process can include moving the probe point (e.g., probe 110) to the chip immediately past the fault (farther along the test progression), and setting the current chip as the scribe line of the new probe point (e.g., new location of probe 110). The process can then return to process P2 to test the scribe line ABIST for the newly placed current chip.

The illustrative method shown and described herein allows for enhanced testing of scribe lines and chips on a semiconductor wafer structure 102. As described herein, the term "testing" can refer to contacting a probe point on a chip 1, 2, 3, etc. or a scribe line 104 with a testing probe. In accordance with various aspects of the invention, the methods described herein allow for the probe point to remain fixed until a fault is indicated in one of the chips and/or scribe lines 104. That is, the probe point can remain fixed while the wafer structure 102 is progressively scanned for faults. As described herein, the terms "subsequent chip" and "further subsequent chip" can refer to any adjacent chip on the semiconductor wafer structure 102. Various embodiments described herein allow for progressive testing of chips and scribe lines on the wafer structure 102 (or a similar structure). It is understood that the processes described with respect to FIG. 2 can be repeated (e.g., moving of the probe point, testing of further subsequent scribe line ABIST, etc.) for all of the chips on the semiconductor wafer (e.g., semiconductor wafer structure 102). It is understood that after testing of an entire semiconductor wafer, functional testing may be performed on that wafer in accordance with conventional approaches. In some cases, where a threshold number of adjacent scribe lines are found to be faulty, the portion of the wafer outlined by those scribe lines can be identified and omitted from a subsequent functional test. In some cases, this threshold number of adjacent scribe lines is approximately 3-4 scribe lines.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of testing a semiconductor wafer, the method comprising:

placing a probe on a first chip on the semiconductor wafer;

testing a scribe line automatic built-in self-test (ABIST) for the first chip to search for a fault;

progressively testing a subsequent scribe line ABIST for a subsequent chip on the semiconductor wafer in response to determining the ABIST for the first chip does not indicate the fault;

moving the probe point to the subsequent chip and retesting the subsequent scribe line ABIST in response to determining the ABIST for the subsequent chip indicates a fault; and testing a further subsequent scribe line ABIST for a further subsequent chip on the semiconductor wafer in response to determining the retesting of the subsequent scribe line ABIST does not indicate a fault in the subsequent scribe line ABIST.

2. The method of claim 1, further comprising moving the probe point to the further subsequent chip and retesting the further subsequent scribe line ABIST in response to determining the ABIST for the further subsequent chip indicates the fault in the ABIST for the subsequent chip.

3. The method of claim 1, wherein the testing includes contacting a probe point with a testing probe.

4. The method of claim 1, wherein the probe point remains fixed until the fault is indicated.

5. The method of claim 1, wherein each the subsequent chip is adjacent to the first chip, and the further subsequent chip is adjacent to the subsequent chip.

6. The method of claim 1, further comprising repeating the moving of the probe point and the testing of the further subsequent scribe line ABIST for a remainder of chips on the semiconductor wafer.

7. The method of claim 6, further comprising performing a functional test on the semiconductor wafer after the repeating of the moving of the probe point and the testing of the further subsequent scribe line ABIST for the remainder of the chips on the semiconductor wafer.

8. The method of claim 1, wherein the scribe line ABIST for the first chip, the subsequent chip and the further subsequent chip are electrically connected.

9. The method of claim 1, wherein the scribe line ABIST for the first chip, the subsequent chip and the further subsequent chip each include circuitry for providing an identity when probed.

10. The method of claim 1, wherein the scribe line ABIST for the first chip, the subsequent chip and the further subsequent chip are each digitally testable.

11. A method of testing a semiconductor wafer, the method comprising:

placing a probe on a chip on the semiconductor wafer;

testing a scribe line automatic built-in self-test (ABIST) for the chip to search for a fault;

progressively testing a subsequent scribe line ABIST for each of a plurality of subsequent chips on the semiconductor wafer in response to determining the ABIST for the first chip does not indicate the fault;

moving the probe point to a first subsequent chip and retesting the subsequent scribe line ABIST for the first subsequent chip in response to determining the ABIST for the first subsequent chip indicates a fault;

moving the probe point to a further subsequent chip in the plurality of subsequent chips and testing a further subsequent scribe line ABIST for the further subsequent chip in response to the retesting of the subsequent scribe line ABIST indicating a fault; and testing a remainder of the plurality of subsequent chips to search for an additional fault.

12. The method of claim 11, wherein the testing includes contacting a probe point on the chip with a testing probe.

13. The method of claim 11, wherein the scribe line ABIST for the chip, the subsequent chip and the further subsequent chip are electrically connected.

14. The method of claim 11, wherein the scribe line ABIST for the chip, the subsequent chip and the further subsequent chip each include circuitry for providing an identity when probed.

15. The method of claim 11, wherein the scribe line ABIST for the chip, the subsequent chip and the further subsequent chip are each digitally testable.

16. A method comprising:
    providing a semiconductor wafer structure having:
        a plurality of chips; and
        a plurality of scribe lines, each scribe line separating two adjacent chips in the plurality of chips,
        wherein each scribe line includes a built-in self-test (BIST) engine configured to provide identity information about the scribe line in response to contact from a probe;
    placing the probe on a first chip in the plurality of chips on the semiconductor wafer structure;
    testing a scribe line automatic built-in self-test (ABIST) for the first chip to search for a fault;
    progressively testing a subsequent scribe line ABIST for a subsequent chip on the semiconductor wafer in response to determining the ABIST for the first chip does not indicate the fault;
    moving the probe point to the subsequent chip and retesting the subsequent scribe line ABIST in response to determining the ABIST for the subsequent chip indicates a fault; and
    testing a further subsequent scribe line ABIST for a further subsequent chip in the plurality of chips on the semiconductor wafer structure in response to determining the retesting of the subsequent scribe line ABIST does not indicate a fault in the subsequent scribe line ABIST.

17. The method of claim 16, the BIST engine further including a digitally testable probe point.

18. The method of claim 16, wherein adjacent scribe lines in the plurality of scribe lines are electrically connected.

* * * * *